United States Patent
Riedel

(10) Patent No.: US 6,548,939 B2
(45) Date of Patent: Apr. 15, 2003

(54) PIEZOELECTRIC BENDING TRANSDUCER

(75) Inventor: Michael Riedel, Rödental (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/002,927

(22) Filed: Nov. 2, 2001

(65) Prior Publication Data

US 2002/0084720 A1 Jul. 4, 2002

Related U.S. Application Data

(63) Continuation of application No. PCT/DE00/01272, filed on Apr. 25, 2000.

(30) Foreign Application Priority Data

May 4, 1999 (DE) .......................................... 199 20 576

(51) Int. Cl.$^7$ ............................................... H01L 41/08
(52) U.S. Cl. ...................................... 310/330; 310/331
(58) Field of Search ................................. 310/330, 331, 310/332, 345

(56) References Cited

U.S. PATENT DOCUMENTS

| | | | |
|---|---|---|---|
| 4,363,993 A | 12/1982 | Nishigaki et al. ............ | 310/332 |
| 4,649,313 A | 3/1987 | Ogawa et al. ................ | 310/358 |
| 5,126,615 A | 6/1992 | Takeuchi et al. ............. | 310/330 |
| 5,210,455 A | 5/1993 | Takeuchi et al. ............. | 310/328 |
| 5,404,067 A | 4/1995 | Stein et al. .................. | 310/330 |
| 5,681,410 A | 10/1997 | Takeuchi et al. ............. | 156/89 |
| 5,852,589 A | * 12/1998 | Wilson et al. ............... | 310/334 |
| 6,003,968 A | * 12/1999 | Kozawa ........................ | 347/20 |

FOREIGN PATENT DOCUMENTS

| | | | |
|---|---|---|---|
| DE | 30 46 525 A 1 | 8/1981 | ........... H01L/41/08 |
| DE | 3434726 C2 | 4/1985 | ........... H01L/41/08 |
| DE | 40 25 436 A 1 | 2/1992 | ........... H01L/41/04 |
| DE | 43 27 265 A1 | 2/1995 | ........... B60H/1/34 |
| DE | 196 24 204 C 1 | 10/1997 | ........... H01L/41/08 |
| DE | 196 20 826 A 1 | 11/1997 | ......... H01L/41/083 |
| EP | 0 455 342 B1 | 11/1991 | ........... H01L/41/09 |
| EP | 0 468 796 A1 | 1/1992 | ........... H01L/41/04 |
| EP | 0 542 772 B1 | 5/1993 | ........... H01L/41/09 |
| JP | 62-147979 | * 7/1987 | .................. 310/311 |
| JP | 1-138977 | * 5/1989 | ............ H02N/2/00 |

OTHER PUBLICATIONS

"Chemical and Physical Properties of Kevlar Fiber", XP–002145060, dated 1993, pp. 26–37 and 58–69; Dec. 1993.

International Search Report for PCT/DE00/01272, issued by the European Patent Office on Sep. 7, 2000.

* cited by examiner

*Primary Examiner*—Thomas M. Dougherty
(74) *Attorney, Agent, or Firm*—Laurence A. Greenberg; Werner H. Stemer; Gregory L. Mayback

(57) ABSTRACT

The piezoelectric bending transducer has a support formed of a fiber-reinforced thermosetting material and a piezoceramic layer thermobonded to at least one side of the support. The fiber material has a coefficient of thermal expansion of less than $-0.5 \cdot 10^{-6}$/K and the fibers extend unidirectionally and parallel to the longitudinal direction of the support. The novel bending transducer exhibits superior deflection capabilities.

9 Claims, 1 Drawing Sheet

PIEZOELECTRIC BENDING TRANSDUCER

CROSS-REFERENCE TO RELATED APPLICATION

This application is a continuation of copending International Application No. PCT/DE00/01272, filed Apr. 25, 2000, which designated the United States.

BACKGROUND OF THE INVENTION

Field of the Invention

The invention relates to a piezoelectric bending transducer with a support consisting of a thermosetting material that is reinforced with fibers and with a piezoceramic coating that is thermobonded to at least one side of the support.

A bending transducer of this type is known for example from U.S. Pat. No. 5,404,067 (European patent EP 0 542 772 B1), German patent DE 196 20 826 B2, U.S. Pat. No. 4,363,993 (German patent application DE 30 46 535 A1). In U.S. Pat. No. 5,404,067 (EP 0 542 772 B1) and U.S. Pat. No. 4,363,993 (DE 30 46 535 A1), graphite is mentioned as the fiber material. In DE 196 20 826 C2, glass is specified as a further fiber material. The piezoceramic is, for example, a lead-zirconate-titanium ceramic.

A piezoelectric bending transducer of the type stated at the beginning serves primarily for utilizing the indirect or reciprocal piezoelectric effect, i.e. for the conversion of electrical energy into mechanical energy. There are many technical applications for a bending transducer. Such applications are, for example, as a piezoelectric printing head for an inkjet printer, as an acoustic pickup or generator for microphones or loudspeakers, as a sensor for acceleration or pressure measurement, as an adjusting element in lines of Braille in reading devices for the visually impaired, in textile machines, in pneumatic valves, in recording instruments or in contactless surface measuring instruments.

According to U.S. Pat. No. 5,126,615 (European patent EP 0 455 342 B1) and U.S. Pat. No. 5,210,455 (European patent application EP 0 468 796 A1), a bending transducer is composed of a layered structure. The piezoceramic is in this case applied to a support to improve the mechanical stability or for the purpose of better conversion of electrical energy into mechanical energy. For the electrical bonding, the piezoceramic is provided, if required, on both sides with electrodes in the form of a sheet-like covering consisting of a conductive material.

Depending on the application, the support may be provided on one or both sides with the sequence of layers described.

According to U.S. Pat. No. 4,649,313 (German patent DE 34 34 726 C2), a plurality of layers of piezoceramics, including the electrodes, may also be stacked one on top of the other. Depending on the number of piezoceramic layers, they are referred to as mono-, bi-, tri-, etc. or generally multimorph piezoelectric bending transducers.

Piezoelectric bending transducers each with an electrically insulating support are to be found in German published patent DE 43 27 265 C1 and U.S. Pat. No. 5,404,067 (German patent application DE 40 25 436 A1). The use of an electrically insulating support in the case of a bimorph piezoelectric bending transducer allows the sides of the piezoceramics facing the support, or the internal electrodes located on them, to be connected to different potentials. As a result, the activation of the bending transducer can take place exclusively via the inner sides of the internal electrodes, insulated with respect to one another by the support, while the external electrodes are connected to zero potential or ground. This measure makes a piezoelectric bending transducer of this type safe to touch.

The use of a thermosetting material reinforced with fibers as a substrate offers.the advantage of easy and unproblematical processing. For example, the thermosetting material can be processed in the form of what is known as a prepreg (a not yet cured, soft blank containing preimpregnated fibers). The prepreg is played together with the piezoceramics loosely into a corresponding mold. By slight pressing, the prepreg wets the surfaces of the piezoceramics or the electrodes applied to them and adhesively bonds with them as a result. A final heat treatment then causes the prepreg to cure irreversibly to form the thermosetting material and a durable and stable bond of the components of the bending transducer is obtained in a simple way. If a support consisting of metal is used, there are huge difficulties with the construction of the bending transducer. For instance, the cutting to length of such a bending transducer involves major problems in particular, on account of the piezoceramic-metal material pairing. The problems do not occur if a thermosetting material reinforced with fibers is used.

If a bending transducer which is safe to touch is required, graphite is ruled out as the fiber material on account of its electrical conductivity. It is therefore necessary here to resort to glass and consequently, for the support, to a thermosetting material reinforced with glass fibers. With glass fibers, however, a limited deflection of the bending transducer is obtained. A bending transducer with a support consisting of a thermosetting material reinforced with glass fibers exhibits a smaller deflection under the same operating voltage than a bending transducer with a support consisting of a plastic reinforced with graphite fibers.

SUMMARY OF THE INVENTION

It is accordingly an object of the invention to provide a piezoelectric bending transducer, which overcomes the abovementioned disadvantages of the heretofore-known devices and methods of this general type and which exhibits improved deflection capabilities in comparison with comparable priorart bending transducers with supports consisting of a thermosetting material reinforced with fibers.

With the foregoing and other objects in view there is provided, in accordance with the invention, a piezoelectric bending transducer, comprising:

a support formed of a thermosetting material reinforced with fibers of a fiber material; and a piezoceramic coating thermobonded to at least one side of the support;

the support extending in a longitudinal direction and the fibers extending substantially unidirectionally and parallel to the longitudinal direction, and the fiber material having a coefficient of thermal expansion of less than $-0.5 \cdot 10^{-6}$/K.

In other words, the object is achieved according to the invention for a bending transducer of the type stated at the beginning by the fact that the fiber material has a coefficient of thermal expansion of less than $-0.5 \cdot 10^{-6}$/K and the fibers all extend in the longitudinal direction of the transducer support.

The invention is based here on the idea that the better deflection capabilities of a bending transducer with a support consisting of a thermosetting material reinforced with graphite fibers in comparison with a bending transducer with a support consisting of a thermosetting material reinforced with glass fibers have to do with the coefficient of thermal expansion of the fiber material. For instance, glass exhibits a coefficient of thermal expansion of between 5 and $6 \cdot 10^{-6}$/K. Graphite, on the other hand, exhibits a coefficient of thermal expansion of approximately $-0.5 \cdot 10^{-6}$/K. While glass consequently has a positive coefficient of thermal expansion, graphite exhibits a negative coefficient of thermal expansion.

Furthermore, the invention is based on the idea that a prepreg is generally used for the production of a piezoelectric bending transducer with a support consisting of a thermosetting material reinforced with fibers. As mentioned at the beginning, the support is permanently bonded with the piezoceramic by the prepreg being placed onto the piezoceramic and subsequently compressed by pressure and thermobonded during a heat treatment involving curing of the thermosetting material. Since the piezoceramic has a positive response to temperature changes perpendicularly to the direction of polarization, the piezoceramic is prestressed to a certain extent during the heat treatment if fibers with a negative response to temperature changes are used. The prestress of the piezoceramic is also retained after the heat treatment, since the thermosetting material cures as this happens. Initial investigations indicate that the distortion of the lattice structure of the piezoceramic caused by the prestress acts in a way supporting polarization. The piezoceramic thermobonded to the support exhibits a higher linear expansion or contraction under the same operating voltage than the piezoceramic not adhesively bonded to such a support.

Particularly high deflection capabilities of the piezoelectric bending transducer can be achieved if the fiber material has a coefficient of thermal expansion of less than $-3 \cdot 10^{-6}$/K.

Suitable in principle as piezoceramics are all ceramics which exhibit the piezoelectric effect, if need be after polarization in an electrical field. A lead-zirconatetitanium-oxide ceramic, which allows adaptation to different requirements by modifying its composition, is of course suitable in particular. By applying a homogeneous electrical field, a polar axis necessary for the occurrence of the piezoelectric effect is produced in the piezoceramic.

Suitable in principle as the fiber material are all materials which, on the one hand, permit reinforcement of the thermosetting material used and, on the other hand, have the required coefficient of thermal expansion. However, polyamide is advantageously used as the fiber material. A series of polyamides are distinguished by high strength, elasticity and good dimensional stability.

In a particularly advantageous embodiment of the invention, the polyamide is an aramid, i.e. an aromatic polyamide. Representatives of the group of aramids have not only high strength, elasticity and good dimensional stability but also high thermal resistance and, moreover, are distinguished by low expansion. Suitable aramids are, for example, the aramid sold by DuPont under the trade name Kevlar® or the aramid available from Akzo Nobel under the trade name Twaron®.

It is also of advantage if the aramid has a modulus of elasticity of between 100 and 130 GPa. Such an aramid is, for example, the aramid sold by Akzo Nobel with the name Twaron type 1056.

In a further advantageous embodiment of the invention, the fibers are unidirectionally arranged and extend parallel to a predetermined longitudinal direction of the support. In this way, during the thermobonding of the prepreg with the piezoceramic layers, there is a contraction of the support in the longitudinal direction. The piezoceramic of the layers is consequently prestressed in the direction of their expansion or contraction when an electrical field is applied to the electrodes. The unidirectional alignment also achieves the effect of the greatest modulus of elasticity of the support in the longitudinal direction. Transverse effects can be largely ignored.

Further advantageous properties can be achieved if the weight per unit area of fibers in the thermosetting material is between 100 and 900 g/m$^2$.

Advantageously suitable as the material for the thermosetting material is an epoxy resin. An epoxy resin reinforced with fibers in the form of a prepreg can be processed easily and inexpensively to form the piezoelectric bending transducer.

In this case, it is of particular advantage for the properties of the support if the proportion by mass of the epoxy resin in the support is between 40 and 60%. In this way, a sufficiently great hardness and sufficiently high flexibility are achieved at the same time.

For applications wherein a piezoelectric bending transducer which is safe to touch is required, it is of advantage if the support is electrically insulated.

Other features which are considered as characteristic for the invention are set forth in the appended claims.

Although the invention is illustrated and described herein as embodied in a piezoelectric bending transducer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
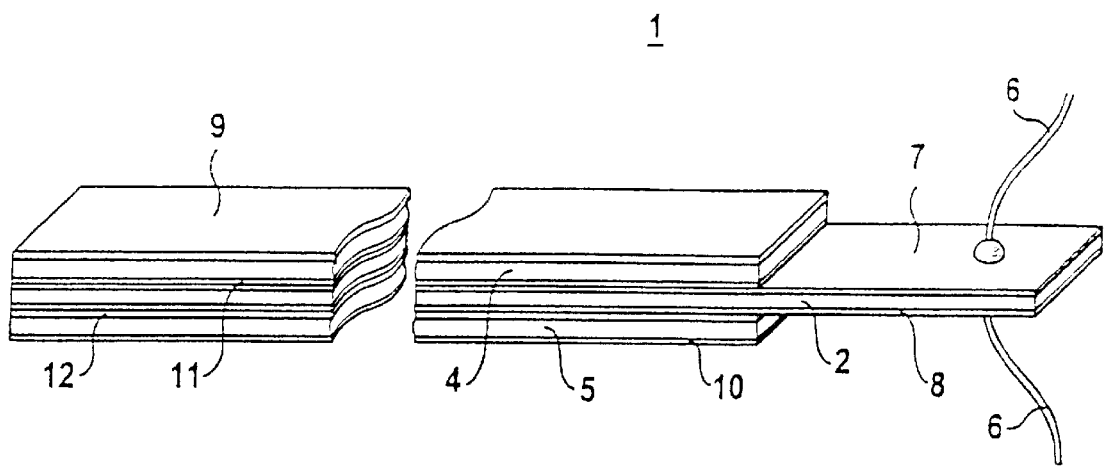
FIG. 1 is a perspective view showing the construction of a piezoelectric bending transducer according to the invention.

Referring now to the figures of the drawing in detail and first, particularly, to FIG. 1 thereof, there is shown a bimorph bending transducer 1 with a support 2 and with first and second piezoceramic coatings 4, 5 applied thereto. The piezoceramic is in this case a lead-zirconate-titanium-oxide ceramic. The support 2 is an epoxy resin reinforced with aramide fibers. Used as the fiber material was TWARON of the type 1056, sold by Akzo Nobel. That aramid has a coefficient of thermal expansion of $-3.5 \cdot 10^{-6}$/K. An epoxy resin prepreg was used as the starting material for the support which had an area-related mass of aramid fibers of 167.4 g/m$^2$ and a proportion of resin mass of 46.4%. The prepreg was thermobonded with the piezoceramic layers 4, 5 and cured by a heat treatment.

The bending transducer 1 furthermore has electrical terminals 6, which are in each case electrically connected via a solder contact to electrodes 7 and 8 arranged on the support 2. The piezoceramic layers 4 and 5 are provided on both sides, in a sheet-like manner, with electrodes 9, 11 and 10, 12, respectively. The electrodes 7 and 8 of the support 2 are, in a way not represented in more detail here, not formed in a sheet-like manner but as a woven mesh or in the form of parallel bars at the locations of the support 2 onto which the piezoceramic layers 4 and 5 have been placed. During the heat treatment of the prepreg, the as yet uncured epoxy resin therefore flows through the electrodes 7 and 8 onto the electrodes 11 and 12 and consequently adhesively bonds the support 2 via the electrodes with the piezoceramic layers 4 and 5 during the curing. The electrodes 9, 10, 11, 12 of the piezoceramic layers 4 and 5 are formed in each case as a sheet-like covering of a carbon polymer. On account of the negative response to temperature changes of the aramid fibers, the piezoceramic is prestressed during the thermobonding.

Figure 2:
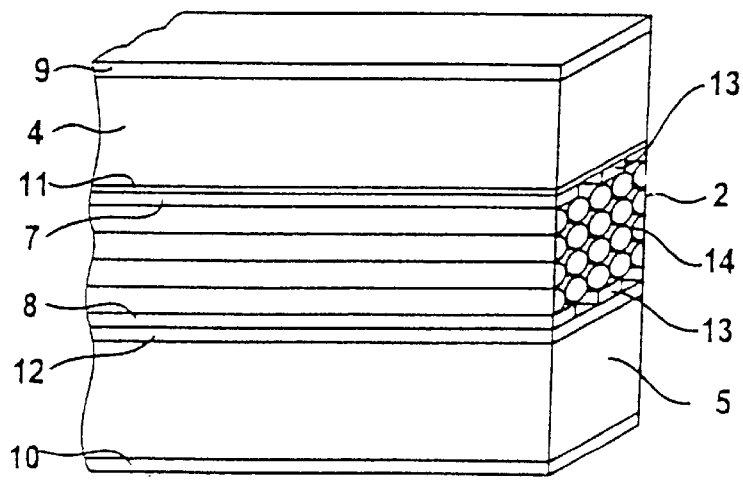
FIG. 2 is an enlarged perspective sectional view of a piezoelectric bending transducer.

Referring now to FIG. 2, there is shown a section through the bending transducer 1 of in FIG. 1 in an enlarged representation. The piezoceramic layers 4 and 5 and also the electrodes 9, 11 and 10, 12 applied to them can again be seen. The electrodes 7, 8 applied to the support 2 are formed as parallel bars 13 extending in the longitudinal direction of the support 2. It can be clearly seen that the aramid fibers 14 are aligned unidirectionally and in the longitudinal direction of the support 2. In this way, during the thermobonding of the prepreg with the piezoceramic layers 4, 5, there is a contraction of the support 2 in the longitudinal direction. The piezoceramic of the layers 4, 5 is consequently prestressed in the direction of their expansion or contraction when an electrical field is applied to the electrodes. The unidirectional alignment of the aramid fibers 14 also achieves the effect of the greatest modulus of elasticity of the support 2 in the longitudinal direction. Transverse effects can be largely ignored.

In a comparison of the bending transducer 1 shown in FIG. 1 with a bending transducer which was of an identical construction but had a support consisting of an epoxy resin reinforced with glass fibers, a 60% higher deflection was measured under the same operating voltage. 200 V was chosen as the operating voltage. The bending transducers compared had a free length of 38 mm and a thickness of 0.75 mm.

I claim:

1. A piezoelectric bending transducer, comprising:
   a support formed of a thermosetting material reinforced with fibers of a fiber material; and
   a piezoceramic coating thermobonded to at least one side of said support;
   said support extending in a longitudinal direction and said fibers extending substantially unidirectionally and parallel to said longitudinal direction, and said fiber material having a coefficient of thermal expansion of less than $-0.5 \cdot 10^{-6}$/K.

2. The bending transducer according to claim 1, wherein said fiber material has a coefficient of thermal expansion of less than $-3 \cdot 10^{-6}$/K.

3. The bending transducer according to claim 1, wherein said fiber material is polyamide.

4. The bending transducer according to claim 3, wherein said polyamide is an aramid.

5. The bending transducer according to claim 4, wherein said aramid has a modulus of elasticity of between 100 and 130 GPa.

6. The bending transducer according to claim 1, wherein said fibers have a weight per unit area, with respect to said thermosetting material, of between 100 and 900 g/m².

7. The bending transducer according to claim 1, wherein said thermosetting material is an epoxy resin.

8. The bending transducer according to claim 7, wherein a proportion by mass of said epoxy resin in said support is between 40 and 60%.

9. The bending transducer according to claim 1, wherein said support is an electrically insulated support.

* * * * *